United States Patent [19]
Nolde et al.

[11] Patent Number: 4,569,085
[45] Date of Patent: Feb. 4, 1986

[54] OSCILLATOR CONTROL CIRCUIT IN AN F.M. RECEIVER

[75] Inventors: Wolfgang Nolde, Hamburg; Winfried Jansen, Hasloh, both of Fed. Rep. of Germany; Wolfdietrich G. Kasperkovitz, Eindhoven, Netherlands

[73] Assignee: U.S. Philips Corporation, New York, N.Y.

[21] Appl. No.: 474,622

[22] Filed: Mar. 11, 1983

[30] Foreign Application Priority Data

Mar. 11, 1982 [DE] Fed. Rep. of Germany ....... 3208758

[51] Int. Cl.$^4$ ............................................. H04B 1/26
[52] U.S. Cl. ................................... 455/208; 455/192; 455/261
[58] Field of Search ............... 455/208, 209, 261, 262, 455/264, 182, 192

[56] References Cited
U.S. PATENT DOCUMENTS
3,784,917  1/1974  Kenyon .............................. 455/262

Primary Examiner—Marc E. Bookbinder
Attorney, Agent, or Firm—Thomas A. Briody; William J. Streeter

[57] ABSTRACT

The invention relates to a circuit for an FM-receiver having a very low intermediate frequency and a tuning frequency-independent amplitude of the LF output signal. The oscillator frequency is controlled in such a way by a reactance circuit that frequency swing reduction occurs. In addition, a reactance circuit is described by means of which a constant fine tuning slope can be obtained during the capacitive tuning of the oscillator circuit.

11 Claims, 3 Drawing Figures

OSCILLATOR CONTROL CIRCUIT IN AN F.M. RECEIVER

BACKGROUND OF THE INVENTION

The invention relates to a circuit for an FM-receiver having a frequency-locked loop, whose loop gain is negative at least for the low frequencies in the demodulated signal. The circuit includes an FM-demodulator, a tunable oscillator circuit whose frequency is controlled by the FM-demodulator output signals and a mixing stage mixing the oscillator signal with an input signal. The output of this mixing stage is coupled to the input of the FM-demodulator.

Such a circuit is disclosed in DE-OS No. 3032701. The total FM-demodulator output-signal not just its DC-component, is employed to control the oscillator frequency. As in the case of tuning to a transmitter, the oscillator frequency changes continuously in accordance with the LF-output signal and more specifically in such a way that the frequency swing of the frequency-modulated input signal is reduced. It is therefore possible to choose an intermediate frequency the magnitude of which is equal or even smaller than that of the frequency swing. For FM-receivers whose input signal has a frequency swing of 75 kHz an intermediate frequency of for example 70 kHz may be chosen. This has the advantage that filtering can be effected in the intermediate-frequency range by means of a simple RC low-pass filter which does not require adjustment.

This prior art FM-receiver has the drawback that the amplitude of the output signal and the transmission bandwidth are highly dependent on the tuning frequency of the oscillator when the oscillator frequency is controlled by the FM-demodulator in known manner with a variable capacity diode.

The invention has for its object a circuit of the above-mentioned type when the amplitude of the output signal and the transmission bandwidth are substantially independent of the tuning frequency of the oscillator.

SUMMARY OF THE INVENTION

According to the invention, this object is accomplished with a loop which comprises a reactance circuit whose reactance is controlled with the FM-demodulator output signal, and is dependent on the tuning frequency of the oscillator circuit. The reactance varies with the tuning frequency as the quotient of an inductance or capacitance change and the oscillator frequency change being effected by said inductance or capacitance change in the oscillator circuit.

Here, a reactance circuit is defined as a circuit comprising an active component the susceptance thereof being controllable proportionally to the signal at the control input.

The invention is based on the recognition that the amplitude of the output signal and the transmission bandwidth on the tuning frequency is a result of the frequency-dependence of the loop gain. If now the susceptance depends on the tuning frequency, a tuning-frequency independent fine tuning slope, the quotient of the change of the oscillator frequency and the change of the instantaneous value of the FM-demodulator output signal, is obtained. This results in a frequency-independent loop gain or a frequency-independent amplitude of the output signal and a frequency-independent transmission bandwidth, respectively.

The required frequency dependence of the reactance depends on the construction of the oscillator circuit and more specifically on the method by which this circuit is tuned. When, for example the oscillator circuit is inductively tuned and a capacitive fine tuning is used for the changing the oscillator frequency according to the demodulator output signal, the capacitance generated by the reactance circuit must be inversely proportional to the tuning frequency. In oscillator circuits which are capacitively tuned, however, it is provided in accordance with a further embodiment of the invention that the reactance circuit functions as a capacitance which is proportional to the inverse value of the third power of the tuning frequency. The conductance of the reactance circuit must then be as small as possible and be independent of the oscillator frequency.

A reactance circuit having such a frequency dependence in accordance with a further embodiment of the invention comprises a higher order low-pass or band-pass network to which the oscillator signal is applied. The filtered signal is multiplied in a multiplying stage by an FM-demodulator output signal. The product signal is fedback to the oscillator circuit so that a capacitive susceptance is produced in parallel with the oscillator circuit. The upper cutoff frequency of the low-pass or band-pass network is chosen such that the maximum of the product of the susceptance and the square of the frequency is located in the tuning frequency range or the vicinity thereof.

In a preferred embodiment the reactance circuit comprises a low-pass network having two low-pass filters. The low-pass filters may each be, for example, of first order and be decoupled relative to each other, that is to say that between the low-pass filters circuit elements are provided such that the transfer function of each of the two low-pass filters is not affected by the other low-pass filter. The total transfer function corresponds to the product of the transfer functions of the individual low-pass filters.

Such a reactance circuit can be used advantageously not only in circuits for receivers of the above-mentioned type, but in other receivers for automatic fine-tuning.

The capacitance generated by this reactance circuit is not accurately proportional to the inverse value of the third power of the tuning frequency, but the deviations from the exact value are slight when the cutoff frequencies of the low-pass filters are chosen such that the maximum product of the susceptance and the frequency is within the tuning frequency range of the oscillator circuit. If the maximum is located at, for example, approximately 98 MHz, then for the overall FM-range (88–108 MHz) deviations of only some one tenth of a percent are produced. When the tuning frequencies are located very high, for example in the ultra-short wave range, the low-pass filters can be realized by RC-components having such a short time constant that they can be produced with integrated circuit techniques.

The invention will now be further described by way of example with reference to the accompanying drawings.

DESCRIPTION OF THE PREFERRED EMBODIMENT

Figure 1:
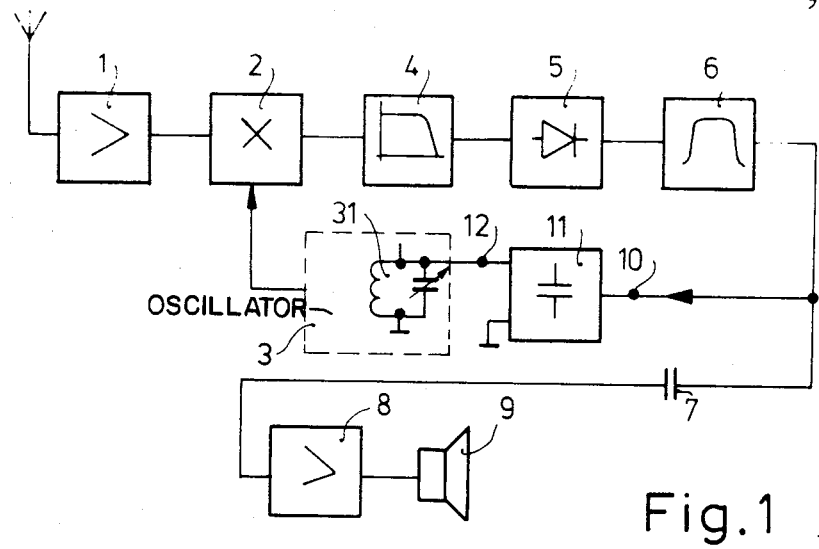
FIG. 1 is a block diagram of a receiver in accordance with the invention.

The block diagram of an FM-receiver shown in FIG. 1, comprises a mixing stage 2, which mixes the input signal supplied by an input amplifier 1 amplifying the aerial signal, with the oscillator signal produced by the oscillator 3. The difference between the frequency of the input signal and the frequency of the oscillator signal is comparatively small, −70 kHz, so that the required selection in the intermediate-frequency range can be effected by means of a low-pass filter 4 of a simple construction. The low-pass filter 4 is followed by an FM-demodulator 5, the amplitude of its output signal being proportional to the frequency deviation between the input signal and the intermediate frequency (70 kHz). The output signal of the FM-demodulator 5 is applied through a suitable filter 6 which is used for the purpose of stabilisation and which may be a simple low-pass filter in the case of mono-receivers and through an isolating capacitor 7, which removes the direct current component from the demodulator output signal, to an amplifier 8 having a de-emphasis element, not shown. The amplifier 8 supplies a loudspeaker 9. The cutoff frequency of the filter 6 is lower than that of the low-pass filter 4, but its bandwidth is dimensioned such that the LF-output signal of the demodulator 5 is not subjected to a frequency-dependent attenuation.

The output signal of the filter 6, that is to say its LF and DC component, respectively is also applied to a control input 10 of the reactance circuit 11. This reactance circuit 11 functions at the output 12 as a capacitance which varies proportionally with the signal at its control input 10. This capacitance is in parallel with the capacitively tunable oscillator circuit 31 of the oscillator 3. This oscillator circuit is a parallel resonant circuit, the detuning of the oscillator circuit produced in response to the change in reactance remaining so small compared to the tuning frequency as to be disregarded. The change in the oscillator frequency produced by the reactance circuit 11 is effected such that the difference between the frequencies of the input signal and the frequency of the oscillator signal is reduced. Depending on the magnitude of the (negative) loop gain in the loop formed by the components 2 . . . 6, 11 the frequency swing of the input signal is thereby compressed to a greater or lesser extent. A practical value for this compression is approximately 5, so that at ultra-short wave reception only a frequency swing of 15 kHz is produced behind the mixing stage, and the intermediate frequency may be lower than the frequency swing of the input signal, without a resultant negative effect on the transmission quality. A problem with such a circuit is that the change in the tuning frequency in response to a capacitance change of the reactance circuit 11 depends on the magnitude of this tuning frequency, and varies more specifically to the third power thereof. The frequency change related to the capacitance change is therefore almost twice as large at the upper limit (108 MHz) of the ultra-short wave range than at the lower limit (88 MHz). As a result the loop gain changes by the third power of the tuning frequency and, consequently, also the amplitude of the LF-output signal and the LF-transmission bandwidth. As the reactance circuit 11 is of such an implementation that its capacitance changes with the inverse value of the third power of the tuning frequency and also proportionally to the amplitude of the signal at the control input 10, a constant loop gain is obtained and the above-described disadvantages of a frequency-dependent loop gain, are eliminated.

Figure 2:
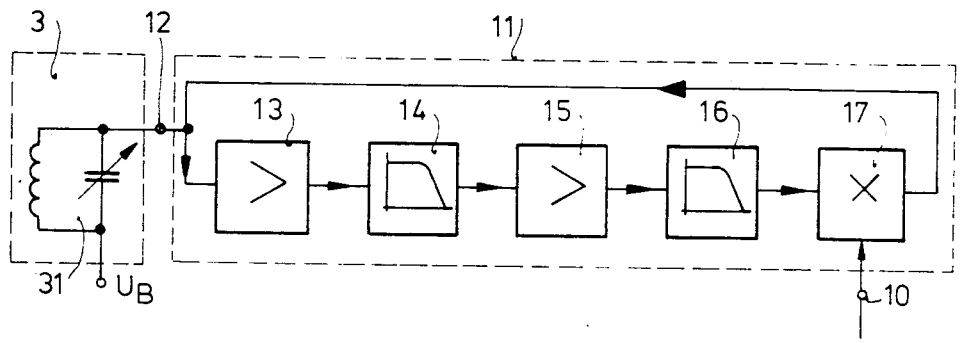
FIG. 2 is a block diagram of a reactance circuit in accordance with the invention.

FIG. 2 shows a block diagram of a reactance circuit having such a frequency dependence. The circuit comprises a first amplifier 13 having a highly resistive input which does not substantially load the oscillator circuit 31. This amplifier is followed by a low-pass filter having the transfer function $1/(1+jw\tau_1)$, wherein w is the frequency of the signal at the output 12 and $\tau_1$ is a time constant which depends on the dimensioning of the low-pass filter 14. This low-pass filter 14 is followed by a second amplifier 15, which decouples the low-pass filter 14 from a further low-pass filter 16 connected to the output of the amplifier 15 having the transfer function $1(1+jw\tau_2)$, wherein $\tau_2$ is a time constant which depends on the dimensioning of the low-pass filter 16. The transfer function of each of the two low-pass filters 14 and 16 is not affected by the input or output, respectively of the other low-pass filter. The output signal of the low-pass filter 16 is applied to an input of a multiplying circuit 17, a further input 10 which is the control input of the reactance circuit 11 and to which the output signal of the FM-demodulator 5 is applied. A signal which is proportionally dependent on the product of the transfer functions of the low-pass filters 14 and 16 and also on the amplitude of the signal at the control input 10 is produced at the output of the multiplying circuit 17.

The multiplying circuit 17 has a highly resistive output and consequently supplies a current signal which is supplied to the output terminal 12 and to the input of the decoupling amplifier 13. The susceptance value then obtained is proportional to the imaginary portion of the product of the transfer functions of the two low-pass filters and capacitive when the elements 13, 15, 17 produce an overall phase shift of 180°.

This product or this susceptance, respectively, corresponds, however, in only a certain frequency range to a capacitance which is proportional to the inverse value of the third power of the frequency. The range in which this condition is satisfied occurs when the product of the susceptance and the square of the tuning frequency is constant, which is the case in the range of of this maximum product. As this maximum usually occurs over a large frequency range, this condition is also satisfied in a fairly large frequency range.

When the two low-pass filters 14 and 16 have, for example, the same frequency characteristics, the maximum of the last-mentioned product is substantially a factor $\sqrt{3}$ higher than the 3 dB cutoff frequency of the two low-pass filters. When the maximum is located in the tuning range of the oscillator 3, the reactance circuit forms a capacitance which varies approximately inversely proportional to the third power of the tuning frequency. The deviations from the ideal value within the tuning range are small when said tuning range is small and comprises the central frequency of the before-mentioned frequency range. With ultra-short wave reception it has, for example, been found that the deviations from the ideal value within the overall tuning range is less than 0.5%, when the 3 dB cutoff frequency is located at approximately 56.3 MHz. The cutoff frequencies for the filter may be at 58% of the centre frequency of the tuning range.

The time constants $\tau_1$ and $\tau_2$ of the two low-pass filters need however not equal each other. Equally satisfactory results are obtained when, for example, the 3 dB cutoff frequencies of the two low-pass filters 14 and 16 and the inverse value of the time constants $\tau_1$ and $\tau_2$, respectively evidence a ratio of 3/4:4/3 and the higher cutoff frequency is approximately 26% below the tuning range, and the cutoff frequency of this higher cutoff filter is 78% larger than the cutoff frequency of the remaining filter, or when the ratio between the two cutoff frequencies is 1:4 and the tuning frequency or the centre of the tuning frequency, respectively is 10% above the higher 3 dB cutoff frequency. The larger the distance between the two cutoff frequencies, the smaller the distance between the higher of the two cuttoff frequencies and the super adjacent centre frequency of the tuning range must be.

Figure 3:
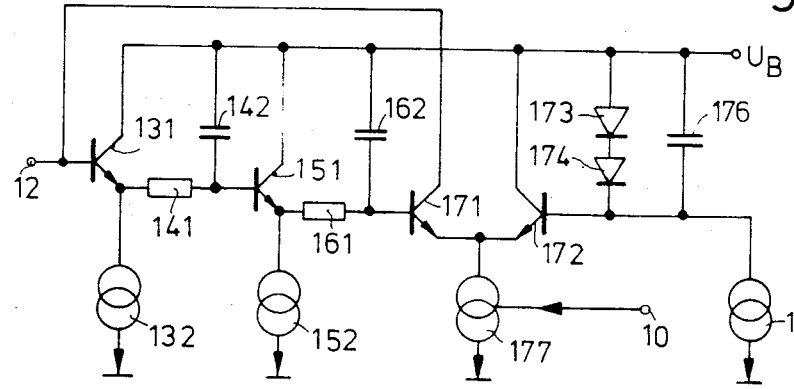
FIG. 3 shows the concrete construction of the reactance circuit.

A preferred embodiment of the reactance circuit shown in the block diagram of FIG. 2 is shown in FIG. 3. The decoupling stage 13 is provided by an emitter-follower having an npn transistor 131 and an emitter-current source 132. The base of the transistor 131 is connected through the output terminal 12 and the inductance of the oscillator circuit 31 to the same voltage $U_B$ to which also the collector of this transistor 131 is connected. A 750 Ohm resistor 141 which together with a 1.8 pF capacitor 142 forms the first low-pass filter 14 is connected to the emitter. The subsequent decoupling stage 15 is also here provided by an emitter follower having a transistor 151 and a current source 152. The two current sources 132 and 152 produce a 100 μA direct current. The emitter of the transistor 151 is connected to a 750 Ohm resistor 161 which together with a capacitor 162, whose other end is connected to the supply voltage $U_B$ forms the low-pass filter 16. The junction of the resistor 161 and the capacitor 162, that is to say the output of this low-pass filter 16 is connected to the base of an npn-transistor 171, whose emitter is connected to the emitter of a transistor 172. The base of the transistor 172 is connected to the positive supply voltage $U_B$ through two diodes 173 and 174 which are in series in the forward direction. A direct current (100 μA) produced by a direct source 175 flows through these diodes 173 and 174, so that the base d.c. voltages of the transistors 171 and 172 are substantially equal to each other. For signals having frequencies located in the ultra-short wave range a capacitor 176 forms substantially a short circuit for the diodes 173 and 174. A controllable current source 177, which produces a current proportionally to the instantaneous value of the signal at the control input 10 is included in the common emitter lead of the transistors 171 and 172. This current is divided substantially equally over the two transistors 171 and 172, the current from the transistor 172 flowing to the supply source $U_B$ and the current from the transistor 171 being fedback to the base of the transistor 131 and to the output terminal 12, respectively.

The reactance circuit described with reference to FIG. 3 is suitable for use in FM-receivers. The 3 dB cutoff frequency (the inverse value of the product of the 750 Ohm resistor and the 1.8 pF capacitor) is considerably higher than shown in FIG. 2, when the parasitic input capacitances of the transistors 161 and 171 in parallel with the capacitors 142 and 162 are taken into account. It will be obvious that the required transfer functions of the low-pass filters can then be obtained. Since the capacitances of the capacitors 142, 162 and 176 are all extremely small, the whole reactance circuit 11 can be produced in a simple way with integrated circuit technique.

The reactance circuit shown in FIG. 2 and FIG. 3, respectively has a negative conductance when the phase shift of the components 13, 15 and 17 amounts to 180°, as a result of which the oscillator 3 is undamped to an additional extent. This oscillator must be dimensioned such that it nevertheless continues to oscillate correctly. The conductance of the reactance circuit increases proportionally to the current of the current source, that is to say proportionally to the output signal of the FM-demodulator and also the extent to which the oscillator is undamped changes accordingly. In certain circumstances this may result in an unwanted amplitude modulation of the oscillator signal and of the IF signal. This can be prevented from occurring by controlling the oscillator with the LF-output signal such that the dependence of the oscillator amplitude on the LF output signal is approximately compensated.

In addition, the conductance also depends on the oscillator frequency, which is however not very disturbing, at least when used in the ultra-short wave range.

Instead of being connected to the transistor 171 the output terminal 12 may alternatively be connected to the collector of transistor 172. The admittance between the terminal 12 and ground then inverses its sign. A negative capacitance is then obtained instead of a positive capacitance, and the capacitance of the oscillator circuit is reduced by the parallel-arranged reactance circuit. This negative capacitance also has the required frequency dependence. The conductance of the reactance circuit is then positive, that is to say the oscillator is undamped, which must be taken account of when dimensioning the oscillator. The dependence of this conductance on the signal at the control input 10 may however be compensated for in a corresponding manner.

The reactance circuit operates satisfactorily, even when the decoupling stage 15 and 151, 152, respectively is omitted, so that the low-pass filters 14 and 16 are in cascade. The desired frequency dependence of the susceptance is then, however, only obtained when the low-pass filter is dimensioned differently. If, for example, the low-pass filters are identical then the 3 dB cutoff frequency, that is to say the inverse value of the time constant, must be approximately 36.8% of the centre frequency of the tuning range.

Low-pass filters 14 and 16 may be networks the susceptance thereof varying at least proportionally to the square of the frequency within the tuning range. The frequency range in which such variation of the susceptance occurs is largest around or in the vicinity of the maximum of the product of the susceptance of the relevant network and the square of the frequency, which means that preferably, this maximum should occur in the tuning range or in the vicinity thereof. Such networks may be second or higher-order networks and may have a low-pass or a bandpass characteristic with a given cutoff frequency defining the last-mentioned frequency range.

What is claimed is:

1. In an FM-receiver having a frequency control loop whose loop gain is negative for the lower frequencies of a demodulated signal, said loop comprising an FM demodulator, a tunable oscillator circuit having a tunable operating frequency, a mixing stage connected to receive an FM signal and a signal from said tunable oscillator circuit to provide an intermediate frequency signal, said Fm demodulator connected to receive said intermediate frequency signal and provide a control voltage indicating a frequency error, a circuit for controlling the frequency of said oscillator circuit, comprising:
  a reactance circuit responsive to said control voltage, said reactance circuit having a reactive value which changes with the operating frequency of said oscillator circuit, such change being related to the quotient of the change in a corresponding capacitance or inductance of said reactance circuit and the change in frequency of said oscillator accompanying said change in reactance, whereby the amplitude and bandwidth of the signal from said demodulator are independent of said oscillator operating frequency.

2. A circuit claimed in claim 1, wherein the reactance circuit provides a variable capacitance of, said capacitance varying substantially as the inverse value of the third power of the frequency of said oscillator.

3. A circuit according to claim 1 wherein said reactance circuit comprises:
  an electrical filter which receives said oscillator circuit signal, a multiplying stage for receiving said filter output signal and said demodulator output signal, said multiplying stage providing a product signal, and means for combining said product signal with said oscillator circuit signal, producing a capacitive susceptance in parallel with said oscillator, said filter being of the second order having an upper cutoff frequency selected to be within a frequency tuning range of said oscillator.

4. A circuit as claimed in claim 3, wherein said electrical filter comprises a low-pass network which includes two serially connected low-pass filters connected by a decoupling stage.

5. A circuit as claimed in claim 3, wherein said electrical filter comprises a low-pass filter network which includes two low-pass filters connected in cascade.

6. A circuit as claimed in claim 4, wherein the cutoff frequencies of the two low-pass filters are equal to each other and are located at approximately 58% of the centre frequency of the tuning frequency range of the oscillator circuit.

7. A circuit as claimed in claim 4, wherein the cutoff frequency of one low-pass filter is approximately four times larger than the cutoff frequency of the other low-pass filter and approximately 10% below the centre frequency of the tuning range of the oscillator circuit.

8. A circuit as claimed in claim 4, wherein the cutoff frequency of one low-pass filter is approximately 78% larger than the cutoff frequency of the other low-pass filter and approximately 26% lower than the centre frequency of the tuning range of the oscillator circuit.

9. A circuit as claimed in claim 5, wherein the two low-pass filters are identical and the cutoff frequencies are each located at approximately 36.8% of the centre frequency of the tuning frequency range of the oscillator circuit.

10. A circuit as claimed in claim 3 wherein the multiplying stage comprises two emitter-coupled transistors the common emitter lead of which includes a current source controlled by the FM-demodulator output signal and whose current is linearly dependent on the FM-demodulator output signal, and the filtered output signal is applied to the base of one of the transistors and the collector current of one of the transistors is combined with the oscillator circuit output signal.

11. In an FM receiver having a frequency control loop, said loop comprising a tunable oscillator circuit, a mixing stage connected to said tunable oscillator and to an antenna connection to provide an intermediate frequency signal, and an FM demodulator circuit for providing a control voltage proportional to a frequency tuning deviation, a reactance circuit for changing the frequency of said oscillator circuit in response to said control voltage, comprising:
  first and second low-pass filter circuits serially connected to receive a signal from said tunable oscillator circuit; and
  a multiplier circuit having a first input connected to receive a signal from said serially connected first and second low-pass filter circuits, and a second input connected to receive said demodulator control voltage, said multiplier circuit providing a feedback product signal; and means for combining said product signals with said oscillator circuit signal, whereby a control loop results having a constant loop gain.

* * * * *